United States Patent [19]

Wolfinger

[11] 4,303,882

[45] Dec. 1, 1981

[54] METHOD AND APPARATUS FOR MONITORING TORSIONAL VIBRATION IN THE ROTOR OF A DYNAMOELECTRIC MACHINE

[75] Inventor: John F. Wolfinger, Schenectady, N.Y.

[73] Assignee: General Electric Company, Schenectady, N.Y.

[21] Appl. No.: 86,405

[22] Filed: Oct. 19, 1979

[51] Int. Cl.³ .................... G01R 31/00; G08B 21/00; H02H 7/06
[52] U.S. Cl. ........................... 324/158 MG; 322/25; 322/99; 361/20
[58] Field of Search ................. 324/158 MG; 322/19, 322/24, 25, 99; 361/20, 21, 30; 340/648

[56] References Cited

U.S. PATENT DOCUMENTS

| | | | |
|---|---|---|---|
| 3,885,420 | 5/1975 | Wolfinger | 324/161 |
| 3,934,459 | 1/1976 | Wolfinger | 73/650 |
| 4,121,272 | 10/1978 | Wolfinger | 361/236 |
| 4,148,222 | 4/1979 | Wolfinger | 73/650 |

FOREIGN PATENT DOCUMENTS 613449  6/1978  U.S.S.R. .............. 324/158 MG

Primary Examiner—Ernest F. Karlsen
Attorney, Agent, or Firm—Ormand R. Austin; John F. Ahern

[57] ABSTRACT

Apparatus and method for monitoring torsional vibration in the rotor of a dynamoelectric machine by detecting electrical quantities available at the output terminals of the machine. For at least one phase of the machine, output voltage and current are detected and a composite signal is formed therefrom in signal processing circuitry. The composite signal is in synchronous phase with the mechanical angle of the rotor and may be demodulated to obtain the torsional vibration information.

13 Claims, 3 Drawing Figures

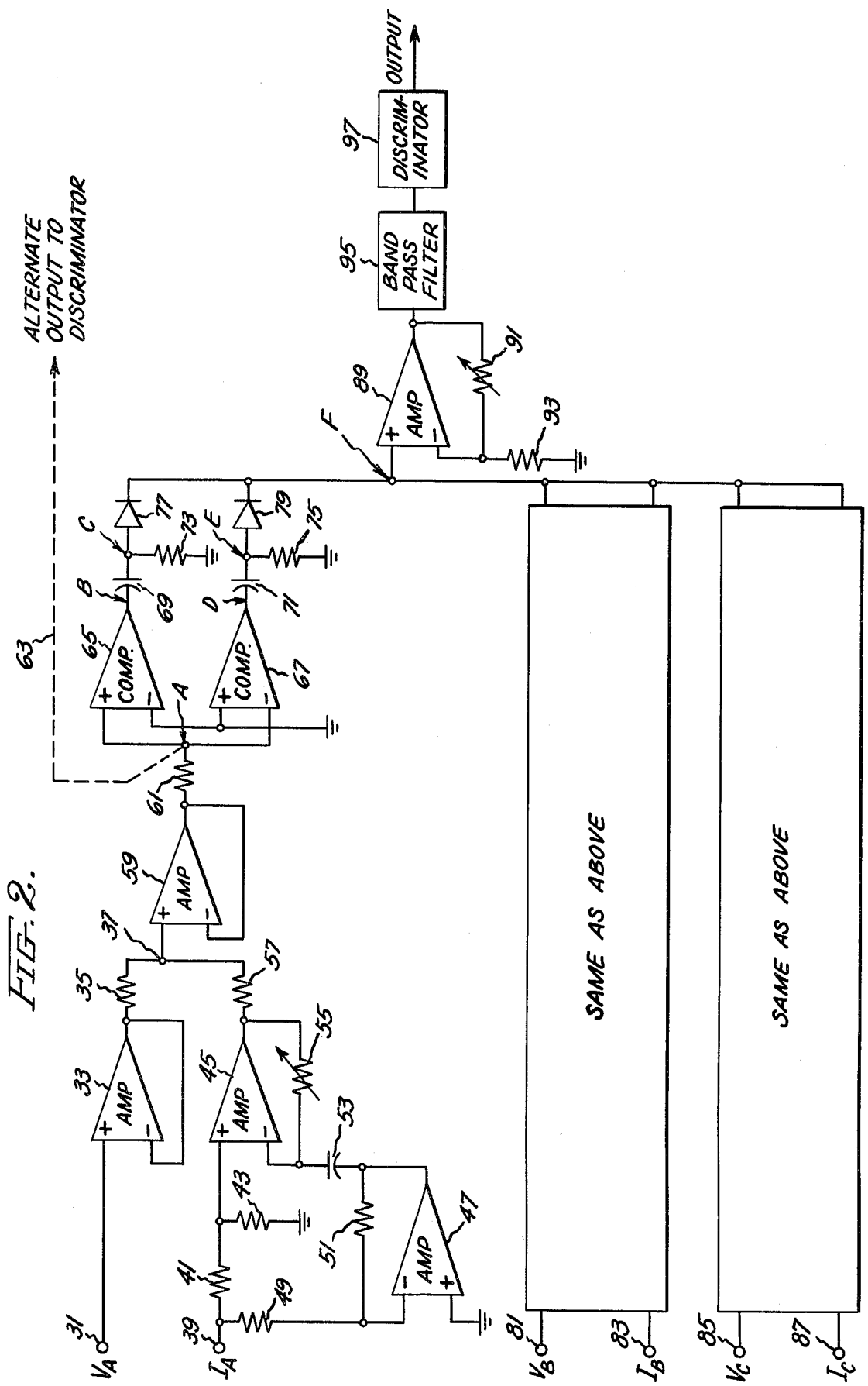

METHOD AND APPARATUS FOR MONITORING TORSIONAL VIBRATION IN THE ROTOR OF A DYNAMOELECTRIC MACHINE

This invention relates to apparatus and a method for measuring small variations in the speed (torsional vibrations) of the rotor of a dynamoelectric machine, and in particular to such apparatus and method wherein the torsional vibration information is derived exclusively from measurements on the output electrical quantities of the dynamoelectric machine.

BACKGROUND OF THE INVENTION

A number of devices have been developed over the years for detecting and measuring torsional vibrations in the various shaft sections comprising the total shaft of a turbine-generator set. These devices have been employed in testing programs as well as continuously on-line to protect the turbine-generator from damaging torques which accompany such vibrations. It has been found that, in large turbine-generator systems, even very small torsional oscillations in the shafts can cause stresses which may damage the shafts, and in the most extreme cases, result in shaft breakage and destruction of the machine itself. These vibrations, manifested as deviations from a uniform angular velocity, appear in virtually all rotating portions of the turbine-generator, including the generator rotor and its associated rotating magnetic field. Because the turbine-generator set comprises a system of multiple masses (including, for example, the various turbine sections, the generator rotor, shaft couplings and so forth), the different shaft sections must be separately considered as having different effects on the overall system.

To monitor torsional oscillations in the dynamoelectric machine portion of a turbine-generator system and specifically in the rotor thereof the previously available methods and devices have not been entirely adequate. This inadequacy stems largely from inaccessibility of the rotor for physical attachment of toothed wheels, light reflective stripes or other indicia which may be detected to provide the fundamental indication of rotor speed and upon which the prior art devices depend. Thus, there is a need in the art for means to monitor the torsional vibrations of the rotor of a dynamoelectric machine, free of the requirement of having physical contact with the rotating member.

Accordingly, it is an object of the present invention to provide a method and apparatus for monitoring torsional vibrations in the rotor of a dynamoelectric machine which will eliminate the need for physical contact, attachments, or other modifications to the rotating member.

It is a further object of this invention to provide a monitor of torsional vibrations in the rotor of a dynamoelectric machine by using the electrical quantities available at the output terminals of the dynamoelectric machine.

SUMMARY OF THE INVENTION

Torsional vibrations in the rotor of a dynamoelectric machine are monitored by summing signals representative of the generator output voltages (which typically will be multiphase) with signals representative of voltage drops, or voltage losses internal to the machine, to form a composite signal for each phase of the machine. Voltage drop signals are produced by multiplying a representation of output current by a representation of internal impedance for each phase. Each resulting composite signal is in a synchronous phase relationship with the mechanical angle of the rotor and is phase-modulated by the torsional oscillation information. One or more of the composite signals may be demodulated (discriminated) to obtain the desired torsional oscillation information signal.

In one form of the invention, particularly well adapted for a multiphase generator, the composite signals are put through zero crossing detection and pulse-forming circuitry to provide pulse signal responses upon the occurrence of each zero crossing of the composite signals. The pulses are then combined to produce a higher frequency pulse train containing the torsional vibration information available from all generator phases. This preferred form of the invention, because of inherent higher sampling rate, is capable of responding to higher frequency torsional vibrations. The higher frequency pulse train signal is restored to substantially sine wave form, at a multiple of the pulse train frequency, by means of a band pass filter.

BRIEF DESCRIPTION OF THE DRAWINGS

While the specification concludes with claims particularly pointing out and distinctly claiming the subject matter of the invention, the invention will be better understood from the description taken in connection with the accompanying drawings in which:

FIG. 2 is a circuit diagram of a preferred embodiment of the invention; and

DETAILED DESCRIPTION OF THE PREFERRED EMBODIMENT

Figure 1:
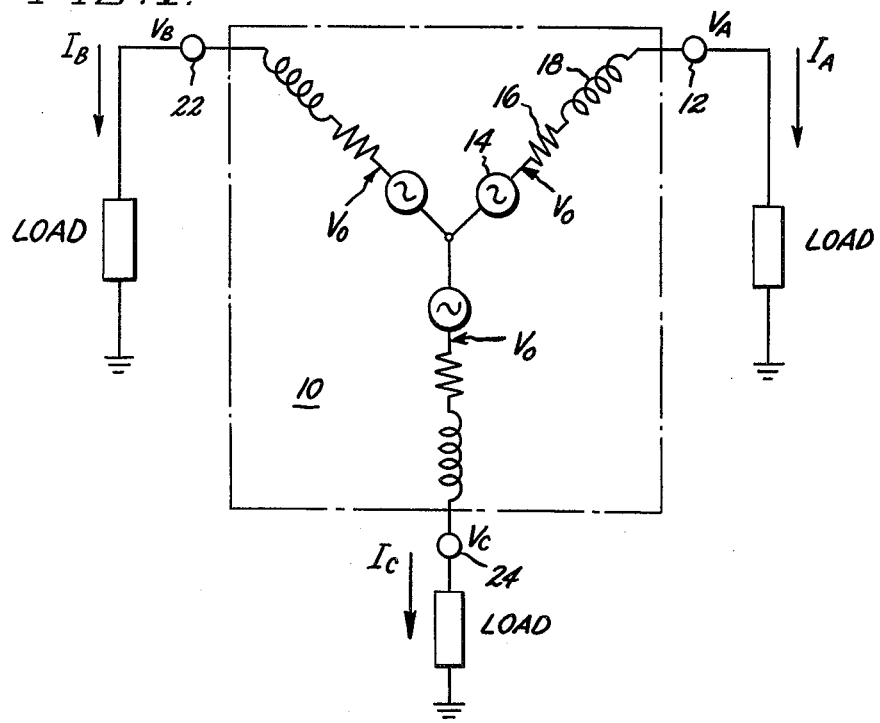
FIG. 1 is an equivalent circuit representation of a three-phase generator useful for explaining the principle and operation of a preferred embodiment of the invention.

To fully comprehend the principles and operation of the invention, it will be useful to first consider a circuit, which for present purposes, is electrically equivalent to a three-phase generator of the type in common use to supply electric power in commercial quantities and upon which it may be desirable to monitor rotor torsional vibrations. Such an equivalent circuit is shown in FIG. 1 in which those components encompassed within the dashed lines may be considered as comprising a three-phase generator 10.

For any one phase of the generator 10 such as, for example, that supplying voltage and current to output terminal 12, there is an associated voltage source 14 and an equivalent series impedance which includes resistance 16 and inductance 18. For any particular dynamoelectric machine the resistance and inductance values are known with good accuracy and are essentially equal from phase to phase. The voltage source 14, as well as all others illustrated, results from the rotating field carried by the generator rotor and the phase angle of the voltage produced is synchronous with the mechanical angle of the rotor. Thus, deviations from a uniform angular velocity in the rotor (torsional vibrations) will appear in the voltage sources of the generating system. For example, source 14 is synchronized with the mechanical rotation of the rotor and mechanical torsional oscillations in the rotor cause corresponding shifts in the phase of the voltage generated by source 14. The generated voltage thus contains information relative to rotor torsional oscillations.

The voltage sources of the equivalent circuit of FIG. 1, however, are not directly accessible in a practical sense, because of the internal impedances such as resistance 16 and inductance 18. The generator output voltages appearing at output terminals 12, 22, and 24 are not in synchronous phase with the angle of rotor rotation because of the intervening impedance elements and effects of time-varying loads and other dynamoelectric machines supplying power to the same loads connected to the terminals 12, 22, and 24. Therefore, analysis of the generator output voltage or current signals alone cannot provide information on the torsional vibrations which may occur in the generator rotor.

Applicant's invention is directed to a method, and apparatus for implementing that method, whereby analogs of the voltages produced by the equivalent voltage sources of FIG. 1 may be constructed and then processed in signal conditioning circuitry to yield a signal containing the desired torsional vibration information. FIG. 2 illustrates preferred circuitry for carrying out the invention for a three-phase generator and is now referred to for further description.

A voltage $V_A$ derived from one phase of the generator and representative of the output voltage of that phase is brought in through input terminal 31. The voltage $V_A$ at terminal 31 may, for example, represent the generator voltage appearing at terminal 12 of FIG. 1. Voltage $V_A$ is buffered by amplifier 33 and then applied through summing resistor 35 to summing junction 37. Simultaneously, a voltage representative of the current $I_A$ flowing from the identical phase of the generator is applied at terminal 39. The voltage at terminal 39 may be provided by a current transformer and a suitable load resistor in a manner well known in the art but not specifically illustrated in FIG. 2. A portion of the voltage representative of $I_A$ is applied by virtue of a voltage divider comprised of resistors 41 and 43 to the noninverting input of amplifier 45. The $I_A$ voltage at terminal 39 is also applied to amplifier 47 through resistor 49 which, with feedback resistor 51, sets the gain of amplifier 47.

Connected between the output of amplifier 47 and the inverting input of amplifier 45 is capacitor 53 which, with feedback resistor 55 and the action of amplifier 45, serve to time differentiate the signal from amplifier 47. Therefore, the signal at the inverting input of amplifier 45 is representative of the time derivative of the negative of the line current for one phase of the generator. The signal appearing at the output of amplifier 45 is the difference between the signal appearing at its two input terminals and is applied through summing resistor 57 to summing junction 37. The resultant composite signal at summing junction 37 represents the sum (for one phase) of the generator output voltage, the generator output current, and the derivative of the generator output current; each of which is appropriately scaled by circuit component values.

Effectively the voltage at junction 37 is given by the following equations:

$$v_o(t) = K_1(R\, i_A + L[di_A/dt]) + K_2 V_A$$

or $$V_o = K_1(R + j\omega L)I_A + K_2 V_A$$

where the first equation describes the voltage in the time domain and the second equation describes the voltage in the frequency domain. These equations are descriptive of the voltage supplied by any one of the equivalent voltage sources of FIG. 1. For the equations, R represents internal series resistance and L represents internal series inductance for one generator phase as illustrated in FIG. 1. With particular reference to the second equation, the term in parenthesis will be recognized as the internal impedance for one phase of the generator which, when multiplied by $I_A$ and $K_1$, produces a term representative of the internal voltage drop for that phase. Other factors in the equation include $K_1$ and $K_2$ which are constants of proportionality whose values are dictated by the parameters of the particular dynamoelectric machine being monitored, and $\omega$, which is the instantaneous angular frequency of the current. $V_A$ and $I_A$ are as previously described.

Relating the second equation above to the circuitry of FIG. 2, amplifier 33 and resistors 35 and 57 proved the $K_2 V_A$ term with the values of resistors 35 and 57 setting the magnitude of $K_2$. The values of summing resistor 57 and resistor 55 set $K_1$ while the relative values of resistors 41 and 43 are determinative of R. Inductive reactance ($j\omega L$) is a result of differentiating capacitor 53, amplifier 47, and resistors 49, 51, and 55. The first term of either equation is simulated by the $I_A$ input branch of the circuitry of FIG. 2 and the second term is simulated by the $V_A$ branch. The terms are brought together at summing junction 37 through, respectively, resistors 57 and 35. The composite signal at summing junction 37 is given by $V_o$ and may thus be referred to herein. $V_o$ is buffered by amplifier 59 and applied through resistor 61 for further processing.

Since the phase of $V_o$ is synchronized with the mechanical angle of the generator rotor, the $V_o$ signal at point A of FIG. 2 may be phase-demodulated by standard discriminator circuitry to extract a signal representative of generator torsional vibrations. The connection for such a discriminator is shown by dashed line 63 in FIG. 2, thus illustrating one embodiment of the invention.

It is preferred that the signal appearing at point A be further processed, however, and combined with signals from the other phases of the generator to increase the effective sampling rate. Increasing the sampling rate, as is predicted by communication and measurement theory, provides for the extraction of higher frequency torsional vibration signals. For example, the sampling rate if all three phases of the machine are monitored is three times that obtained if only one phase is monitored. For a typical 60 Hz three-phase machine, torsional vibrations of up to 180 Hz can thus be monitored.

Figure 3:
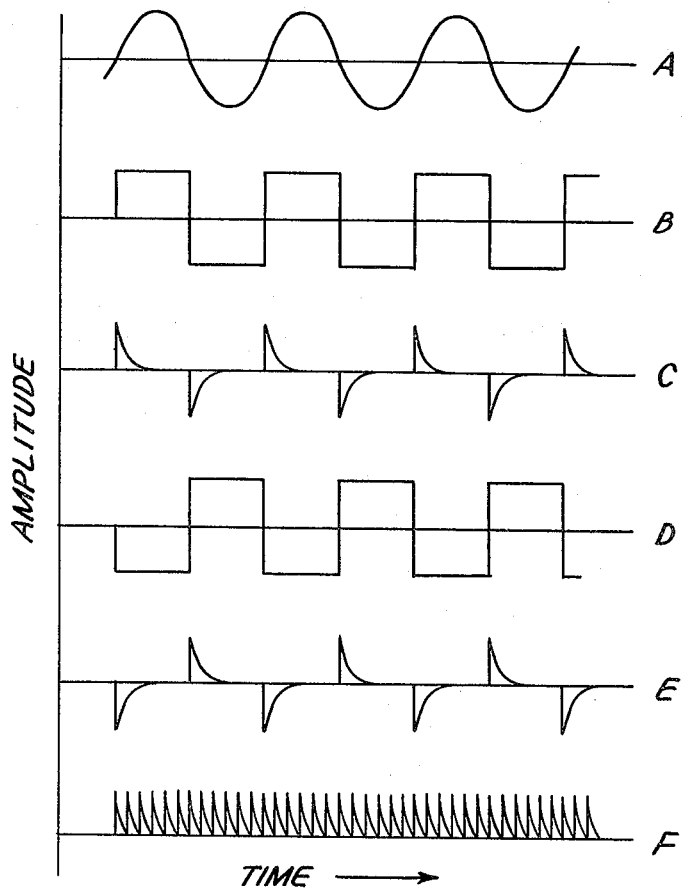
FIG. 3 is an illustration of wave forms appearing at various points in the circuitry of FIG. 2.

Further processing of the $V_o$ signal appearing at point A will now be discussed in conjunction with the wave forms of FIG. 3 wherein the letter designations indicate wave forms appearing at correspondingly marked circuit points in FIG. 2.

The signal at point A, sine wave in character as illustrated, is applied simultaneously to the non-inverting and inverting inputs, respectively, of comparators 65 and 67 which convert the input sine wave to dual square wave output signals 180° out of phase with each other. One of these square wave signals appears at circuit points B, the other at circuit point D. The rising and falling edges of the square waves occur simultaneously with zero crossings of the sine wave signal $V_o$ appearing at point A. Capacitors 69 and 71 are combined, respectively, with resistors 73 and 75 to form networks to differentiate the two square waves of points B and D and produce the corresponding pulse wave forms appearing at points C and E. Diodes 77 and 79 pass only the positive pulses from points C and E to common point F where the two pulse signals are then combined. It will be recognized that the positive pulses so produced are precise markers of the zero crossings of the sine wave signal $V_o$ appearing at point A.

As shown in FIG. 2, circuitry substantially identical to that immediately described above is provided for each of the other phases of the dynamoelectric machine. In this case, for a three-phase machine, two other phases are monitored and the circuitry takes in generator voltage and current signals at terminals 81, 83, 85 and 87 and provides output pulses indicative of zero crossings for each generator phase at point F. The resulting pulse train from combining pulses from all three phases is shown in FIG. 3 as wave form F.

The pulse train is buffered and amplified by amplifier 89, having gain setting resistors 91 and 93, and is then applied to band pass filter 95. The band pass filter 95 is tuned to an upper harmonic of the pulse train signal to obtain a higher frequency signal well away from the power generation frequency thus avoiding interference effects therefrom. For example, the fifth harmonic may be chosen for a three-phase machine, thus giving a signal of 1,800 Hz. This higher frequency signal, once again of sine wave character, as a result of the filtering action of band pass filter 95 contains all of the torsional oscillation information pertaining to the generator rotor. The torsional oscillations have effectively phase-modulated the resultant signal which may then be passed to a discriminator network 97, as indicated, to recover the desired information. A discriminator suitable for this purpose, for example, is that taught by U.S. Pat. No. 3,885,420 to Wolfinger.

Although the invention has been described with reference to particular embodiments, it is to be appreciated that certain changes may be made without departing from the spirit and scope of the invention. Accordingly, it is intended that all matter contained in the above description and shown in the accompanying drawings shall be interpreted as illustrative and not in a limiting sense.

What is claimed is:

1. Apparatus for monitoring torsional vibrations in the rotor of a dynamoelectric machine of at least single phase producing output voltage and current for transfer to a load, said apparatus comprising:
    means for producing signals representative of the output voltages of said dynamoelectric machine, there being one voltage representative signal for each phase of said dynamoelectric machine;
    means for producing signals representative of the output currents of said dynamoelectric machine, there being one current representative signal for each phase of said dynamoelectric machine;
    means for producing representation of internal impedance of said dynamoelectric machine, there being one impedance representation for each phase of said dynamoelectric machine;
    means for correspondingly multiplying said representations of internal impedance by said output current signals to produce signals representative of internal voltage drops of said dynamoelectric machine, there being one voltage drop signal for each phase of said dynamoelectric machine;
    means for correspondingly summing said output voltage signals and said voltage drop signals to produce composite signals in phase with the mechanical angle of the rotor of said dynamoelectric machine, there being on composite signal for each phase of said dynamoelectric machine; and
    means for discriminiating at least one said composite signal to produce an output signal indicative of torsional oscillations in said rotor.

2. Apparatus for monitoring vibrations in the rotor of a dynamoelectric machine of at least single phase producing output voltage and currrent for transfer to a load, said apparatus comprising:
    means for producing signals representative of the output voltages of said dynamoelectric machine, there being one voltage representative signal for each phase of said dynamoelectric machine;
    means for producing signals representative of the output currents of said dynamoelectric machine, there being one current representative signal for each phase of said dynamoelectric machine;
    means for producing representations of internal impedance of said dynamoelectric machine, there being one impedance representation for each phase of said dynamoelectric machine;
    means for correspondingly multiplying said representations of internal impedance by said output current signals to produce signals representative of internal voltage drops of said dynamoelectric machine, there being one internal voltage drop signal for each phase of said dynamoelectric machine;
    means for correspondingly summing said output voltage signals and said voltage drop signals to produce composite signals in phase with the mechanical angle of the rotor of said dynamoelectric machine, there being one composite signal for each phase of said dynamoelectric machine;
    means for producing pulse signals in response to zero crossings of said composite signals, there being one pulse signal for each composite signal;
    means for combining said pulse signals to produce a higher frequency pulse train;
    means for converting said pulse train to a signal of substantially sine wave character whose phase is indicative of torsional vibrations in said rotor.

3. The apparatus of claim 2 wherein said means for producing representations of internal impedance of said dynamoelectric machine comprises:
    a. differentiator network for representing inductive impedance;
    a resistance network for representing resistive impedance; and
    means for summing said inductive impedance and said resistive impedance to provide said internal impedance representation.

4. The apparstus of claim 2 wherein each said means for producing pulse signals comprises:
    a pair of comparators each of which produces a square wave signal in response to said composite signal;
    a pair of differntiator networks each of which produces pulses in response to one of the square wave signals from said comparators; and
    rectifier means for selecting pulses of one polarity from said differentiator networks.

5. The apparatus of claim 2 wherein said means for combining pulse signals comprises an amplifier.

6. The apparatus of claim 2 wherein said means for converting said pulse train to a signal of substantially sine wave character comprises a band pass filter adapted to pass only a higher harmonic frequency of said pulse train.

7. The apparatus of claim 2 further including means for discriminating said substantially sine wave signal to produce an output signal indicative of the torsional vibrations of said rotor.

8. Apparatus for monitoring small variations in the rotational speed of the rotor of a dynamoelectric machine of at least single phase and producing voltage and current for transfer to a load through output terminals, said apparatus comprising for at least one phase of said dynamoelectric machine;
- means for producing a signal representative of the output terminal voltage;
- means for producing a signal representative of voltage drop internal to said dynamoelectric machine;
- means for summing said terminal voltage signal and said internal voltage drop signal to produce a signal representative of instantaneous mechanical angle of said rotor.

9. The apparatus of claim 8 further including:
- means for discriminating said signal representative of instantaneous mechanical angle to produce a signal representative of variations in rotational speed of said rotor.

10. Apparatus for determining variations in the rotational speed of the rotor of a dynamoelectric machine of at least single phase and producing output voltage and current for transfer to a load, said apparatus comprising for at least one phase of said dynamoelectric machine:
- means for providing a signal representative of the output voltage;
- means for providing a signal representative of the output current;
- means for providing a representation of internal impedance;
- means for multiplying said output current signal by said representation of internal impedance to provide a signal representative of voltage drop internal to said dynamoelectric machine;
- means for summing said internal voltage drop signal and said output voltage signal to provide a composite signal phase modulated by said varaitions in rotor speed; and
- means for demodulating said composite signal to provide a signal indicative of said instantaneous variations in rotor speed.

11. A method for determining variations in the rotational speed of the rotor of a dynamoelectric machine producing output voltage and current of at least single phase for transfer to a load, said method comprising for at least one phase of said phase of said dynamoelectric machine the steps of:
 (a) providing a signal indicative of the instantaneous output voltage;
 (b) providing a signal indicative of the instantaneous output current;
 (c) multiplying the output current signal by a quantity representative of internal impedance of said dynamoelectric machine to form a signal indicative of voltage drop internal to said dynamoelectric machine;
 (d) summing said output voltage signal with said internal voltage drop signal to form a composite signal whose phase angle is synchronous with the mechanical angle of said rotor; and
 (e) discriminating said composite signal to obtain a signal determinative of variations in rotational speed of said rotor.

12. A method for determining torsional oscillations in the rotor of a dynamoelectric machine producing output voltage and current of at least one phase for transfer to a load, said method comprising the steps of:
 (a) providing a signal indicative of the output voltage for each phase of the dynamoelectric machine;
 (b) providing a signal indicative of the output current for each phase of the dynamoelectric machine;
 (c) multiplying each output current signal by a quantity representative of internal impedance for each phase to provide a signal indicative of internal voltage drop for each phase of the dynamoelectric machine;
 (d) correspondingly summing said output voltage signals with said internal voltage drop signals to providing a composite signal for each phase of the dynamoelectric machine, each said composite signal having a phase angle synchronous with the mechanical angle of said rotor;
 (e) generating a pulse signal from the composite signal of each phase of the dynamoelectric machine;
 (f) combining pulse signals from all phases of the dynamoelectric machine to provide a higher frequency pulse train;
 (g) converting said pulse train to a sine wave signal; and
 (h) phase demodulating said sine wave signal to provide a signal indicative of torsional oscillations in said rotor.

13. The method of claim 12 further including the steps of:
- taking a higher harmonic signal of said sine wave signal; and
- phase demodulating said higher harmonic signal to provide a signal indicative of torsional oscillations in said rotor.

* * * * *